(12) United States Patent
Zhang et al.

(10) Patent No.: US 9,722,617 B2
(45) Date of Patent: Aug. 1, 2017

(54) PHASE LOCKED LOOP AND ASSOCIATED METHOD FOR LOOP GAIN CALIBRATION

(71) Applicant: MediaTek Singapore Pte. Ltd., Singapore (SG)

(72) Inventors: Huajiang Zhang, Singapore (SG); Jiqing Cui, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/919,708

(22) Filed: Oct. 21, 2015

(65) Prior Publication Data

US 2016/0142063 A1    May 19, 2016

Related U.S. Application Data

(60) Provisional application No. 62/079,997, filed on Nov. 14, 2014.

(51) Int. Cl.
*H03L 7/093* (2006.01)
*H03L 7/087* (2006.01)
*H03L 7/089* (2006.01)

(52) U.S. Cl.
CPC .............. *H03L 7/093* (2013.01); *H03L 7/087* (2013.01); *H03L 7/0893* (2013.01); *H03L 2207/06* (2013.01)

(58) Field of Classification Search
CPC ....................................................... H03L 7/093
See application file for complete search history.

(56) References Cited

U.S. PATENT DOCUMENTS

| | | | |
|---|---|---|---|
| 7,382,201 B1 | 6/2008 | Yu | |
| 8,031,008 B2 | 10/2011 | Wang | |
| 9,246,500 B2 * | 1/2016 | Perrott | .................... H03L 7/093 |
| 9,312,867 B2 * | 4/2016 | Yang | ........................ H03L 7/085 |

* cited by examiner

*Primary Examiner* — Hai L Nguyen
(74) *Attorney, Agent, or Firm* — Winston Hsu

(57) ABSTRACT

A phase locked loop (PLL) includes a controllable oscillator, a charge pump, a type II loop filter, a frequency divider and a phase error processing circuit. The controllable oscillator generates an oscillating signal. The charge pump circuit receives a calibration signal and generates a charge pump output according to the calibration signal when the PLL operates in a calibration mode. The type II loop filter receives the charge pump output, and generates a first control signal to the controllable oscillator according to the charge pump output. The frequency divider receives the oscillating signal and an adjusting signal, and refers to the adjusting signal to perform frequency division upon the oscillating signal for generating a feedback signal. The phase error processing circuit receives the feedback signal and a reference signal, and outputs the adjusting signal based on a comparison result of the reference signal and the feedback signal.

18 Claims, 6 Drawing Sheets

PHASE LOCKED LOOP AND ASSOCIATED METHOD FOR LOOP GAIN CALIBRATION

CROSS REFERENCE TO RELATED APPLICATIONS

This application claims the benefit of U.S. provisional application No. 62/079,997, filed on Nov. 14, 2014 and incorporated herein by reference.

BACKGROUND

The present invention relates to a phase-locked loop (PLL), and more particularly, to a loop gain compensation scheme for a controllable oscillator in a PLL, and a method thereof.

FIG. 1 is a related art phase locked loop (PLL) 100. The PLL 100 includes a phase/frequency detector 111, a charge pump circuit 112, a loop filter 113, a voltage-controlled oscillator (VCO) 114, a frequency divider 115 and a modulating device 12. The PFD 111 is arranged to receive a reference signal $F_{ref}$ and a feedback signal $F_{fb}$, and output a pulse signal according to a comparison result of the feedback signal $F_{fb}$ and the reference signal $F_{ref}$. The charge pump circuit 112 is arranged to convert the pulse signal into an error current. The loop filter 113 is arranged to integrate the error current to generate a control voltage. The VCO 114 is arranged to receive the control voltage from the loop filter 113 and generate an oscillating signal $F_{VCO}$ according to the control voltage. The frequency divider 115 is arranged to generate the feedback signal $F_{fb}$ according to the oscillating signal received from the VCO 114.

For simplicity in loop gain calibration, a type I PLL based transmitter is usually applied in communication systems, e.g. the loop filter 113 shown in FIG. 1 is a type I PLL. The type I PLL cannot track the temperature ramping, however, thus causing frequency errors when the temperature changes.

Therefore, there is a need for a novel method and an associated apparatus to solve the above issue.

SUMMARY

One of the objectives of the present invention is to provide a phase-locked loop (PLL) with a loop gain calibration scheme to solve the above issue.

According to an embodiment of the present invention, a PLL is provided. The PLL includes a controllable oscillator, a charge pump, a type II loop filter, a frequency divider and a phase error processing circuit. The controllable oscillator is arranged to generate an oscillating signal. The charge pump circuit is arranged to receive a calibration signal and generate a charge pump output according to the calibration signal when the PLL operates in a calibration mode. The type II loop filter is arranged to receive the charge pump output, and generate a first control signal to the controllable oscillator according to the charge pump output. The frequency divider is arranged to receive the oscillating signal outputted from the controllable oscillator and an adjusting signal, and refer to the adjusting signal to perform frequency division upon the oscillating signal for generating a feedback signal. The phase error processing circuit is arranged to receive the feedback signal and a reference signal, and output the adjusting signal based on a comparison result of the reference signal and the feedback signal.

According to another embodiment of the present invention, a method for controlling a PLL is provided. The method includes: configuring a controllable oscillator (VCO) to generate an oscillating signal (FVCO); generating a charge pump output of a charge pump circuit according to a calibration signal when the PLL operates in a calibration mode; configuring a type II loop filter to receive the charge pump output, and generate a first control signal to the controllable oscillator according to the charge pump output; referring to an adjusting signal to perform frequency division upon the oscillating signal for generating a feedback signal (FDIV); and modifying the adjusting signal based on a comparison result of a reference signal and the feedback signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
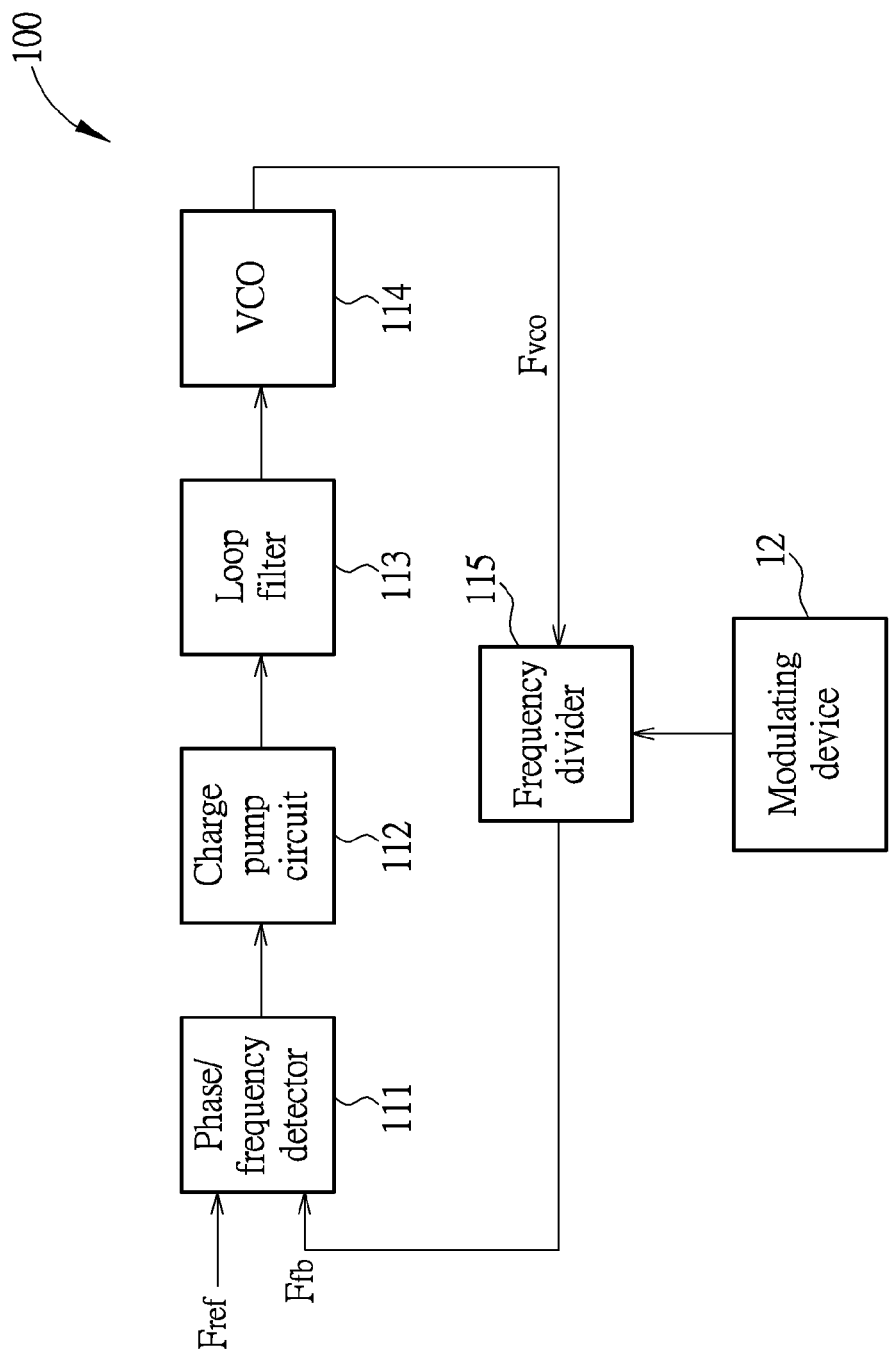
FIG. 1 is a related art phase locked loop (PLL).
Figure 2:
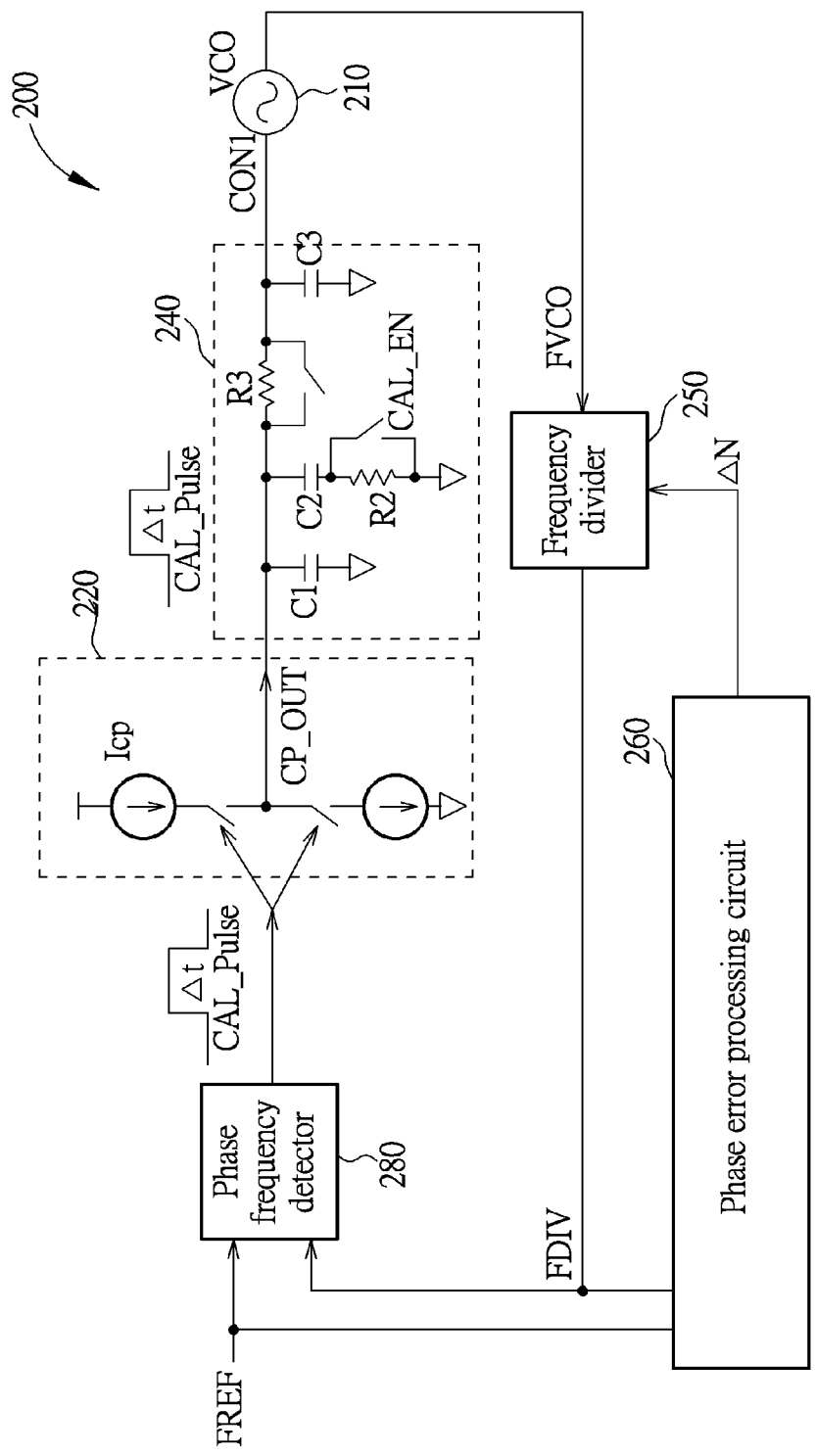
FIG. 2 is a diagram illustrating a PLL according to an embodiment of the present invention.

FIG. 2 is a diagram illustrating a PLL 200 according to an embodiment of the present invention. The PLL 200 includes a controllable oscillator 210, a charge pump circuit 220, a type II loop filter 240, a frequency divider 250, a phase error processing circuit 260 and a phase frequency detector 280. The controllable oscillator 210 is arranged to generate an oscillating signal FVCO. In this embodiment, the controllable oscillator 210 is assumed as a voltage control oscillator (VCO), but the present invention is not limited thereto. Note that the PLL 200 may operate in one of a normal operation mode and a calibration mode. When the PLL 200 operates in the calibration mode, the charge pump circuit 220 is arranged to receive a calibration signal CAL_Pulse from the phase frequency detector 280, and generate a charge pump output CP_OUT according to the calibration signal CAL_Pulse to the controllable oscillator 210. Further, the phase PFD 280 is arranged to receive the feedback signal FDIV and the reference signal FREF, and compare the feedback signal FDIV and the reference signal FREF to generate a detection signal UP/DN.

The type II loop filter 240 is arranged to receive the charge pump output CP_OUT, and generate a control signal CON_1 to the controllable oscillator according to the charge pump output CP_OUT. The frequency divider 250 is arranged to receive the oscillating signal FVCO outputted from the controllable oscillator 210 and an adjusting signal ΔN from the phase error processing circuit 260, and refer to the adjusting signal ΔN to perform frequency division upon the oscillating signal FVCO for generating a feedback signal FDIV. The phase error processing circuit 260 is arranged to receive the feedback signal FDIV and a reference signal FREF in order to generate the adjusting signal ΔN.

The type II loop filter 240 may be composed of passive elements, but this is not a limitation of the present invention. In some embodiments, the type II loop filter 240 may comprise active elements. In general, a type II loop filter comprises at least a capacitor and a resistor coupled in series. For example, the loop filter 240 comprises at least the capacitor C2 and the resistor R2 coupled in series. During the calibration, the resistors R2 and R3 may both be short-circuited, in order to eliminate ripples.

Figure 3:
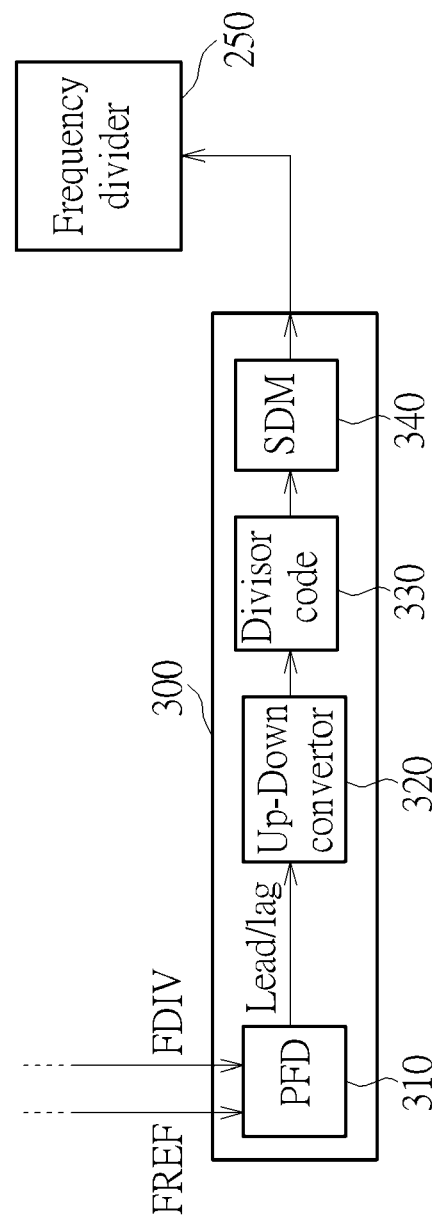
FIG. 3 is a diagram illustrating a phase error processing circuit 300 in the PLL shown in FIG. 2 according to an embodiment of the present invention.

FIG. 3 is a diagram illustrating a phase error processing circuit 300 in the PLL 200 shown in FIG. 2 according to an embodiment of the present invention. The phase error processing circuit 300 may be an embodiment of the phase error processing circuit 260 shown in FIG. 2. The phase error processing circuit 300 includes a phase frequency detector (PFD) 310, an Up-Down convertor 320 and a sigma-delta modulator (SDM) 340. By way of example, not limitation, the PFD 310 may be a Bang Bang PFD. The PFD 310 is arranged to receive the feedback signal FDIV and the reference signal FREF, and compare the feedback signal FDIV and the reference signal FREF to generate a detection signal (denoted as lead/lag in FIG. 3). The detection signal is arranged to inform the Up-Down convertor 320 of the lead/lag information of the comparison result of the reference signal FREF and the feedback signal FDIV. Block 330 represents that the Up-Down convertor 320 transmits a divisor code signal N_guess to the SDM 340, wherein the divisor code signal N_guess is generated according to the detection signal. The SDM 340 is arranged to receive the divisor code signal N_guess and generate the adjusting signal ΔN based on the divisor code signal N_guess. Specifically, the adjusting signal ΔN is arranged to adjust a dividing factor (e.g. the divisor number) of the frequency divider 250.

To be more specific, the variation of the dividing factor of the frequency divider 250 can be represented by Equation 3.1:

$$\Delta N = \frac{\Delta f_{VCO}}{FREF} = I_{CP}\frac{\Delta t}{A_0}K_{VCO}\frac{1}{FREF} \quad (3.1)$$

wherein ΔN denotes the variation of the dividing factor applied to the frequency divider 250, $I_{CP}$ denotes a current value of the charge pump circuit 230, $\Delta f_{VCO}$ denotes a frequency shift of the controllable oscillator 210, Δt denotes a period of the calibration signal CAL_Pulse, and $A_0$ denotes a capacitance value of the loop filter 240 when the PLL 200 operates in the calibration mode. For example, $A_0$ may represent the capacitance total of the loop filter 240. In the case of FIG. 2, $A_0=C_1+C_2+C_3$. Further, the divisor code signal N_guess may be $\Delta N \cdot 2^{23}$ for a 23-bit SDM, but this is not a limitation of the present invention.

The loop gain calibration parameter $K_{LG}$ can be represented by Equation 3.2:

$$K_{LG} = \frac{K_{VCO} \cdot I_{CP}}{N \cdot A_0} \cdot \frac{N'}{K_{VCO}' \cdot I_{CP}'/A_0'} \quad (3.2)$$

wherein $K_{VCO}$ denotes an ideal gain of the controllable oscillator, $K_{VCO}'$ denotes an actual gain of the controllable oscillator 210 (note that in following descriptions, each parameter followed by an apostrophe (i.e. prime) relates to an actual case), $I_{CP}$ denotes an ideal current value of the charge pump circuit 230, $I_{CP}'$ denotes an actual current value of the charge pump circuit 230, N denotes an ideal dividing factor, N' denotes an actual dividing factor, $A_0$ denotes an ideal capacitance value of the type II loop filter 240 when the PLL 200 operates in the calibration mode, and $A_0'$ denotes an actual capacitance value of the type II loop filter 240 when the PLL 200 operates in the calibration mode. In Equation 3.2, loop gain calibration parameter $K_{LG}$ represents a ratio between the ideal gain and actual gain of the controllable oscillator 210.

By substituting Equation 3.1 into Equation 3.2, the loop gain calibration parameter $K_{LG}$ can be obtained by Equation 3.3:

$$K_{LG} = \frac{K_{VCO} \cdot I_{CP} \cdot \Delta t}{N \cdot A_0} \cdot \frac{N'}{K_{VCO}' \cdot I_{CP}' \cdot \Delta t/A_0'} = \\ \frac{K_{VCO} \cdot I_{CP} \cdot \Delta t}{N \cdot A_0} \cdot \frac{N'}{N\_GUESS \cdot \frac{26M}{2^{23}}} \quad (3.3)$$

wherein the reference signal FREF in this embodiment is assumed as 26 MHz, but this is not a limitation of the present invention.

For the up pulse and the down pulse of the calibration signal CAL_Pulse, Equation 3.3 may be modified as Equation 3.4:

$$K_{LG} = \frac{K_{VCO} \cdot I_{CP} \cdot \Delta t}{N \cdot A_0} \cdot \frac{N'}{(N_{GUESS_1} - N\_GUESS2) \cdot \frac{26M}{2^{23}}} \quad (3.4)$$

where $A_0=C_1+C_2+C_3$, N_GUESS1 denotes the divisor code signal for the up pulse (e.g. the logic high part) of the calibration signal CAL_Pulse, and N_GUESS2 denotes the divisor code signal for the down pulse (e.g. the logic low part) of the calibration signal CAL_Pulse.

Through the above calculations, the loop gain calibration parameter $K_{LG}$ may be obtained to calibrate the loop gain of the PLL 200. For example, the loop gain calibration parameter $K_{LG}$ may show the extent of the loop gain calibration accuracy, in order to obtain a more accurate loop gain. The error/influence caused by the change of the VCO frequency may be mitigated/eliminated.

Figure 4:
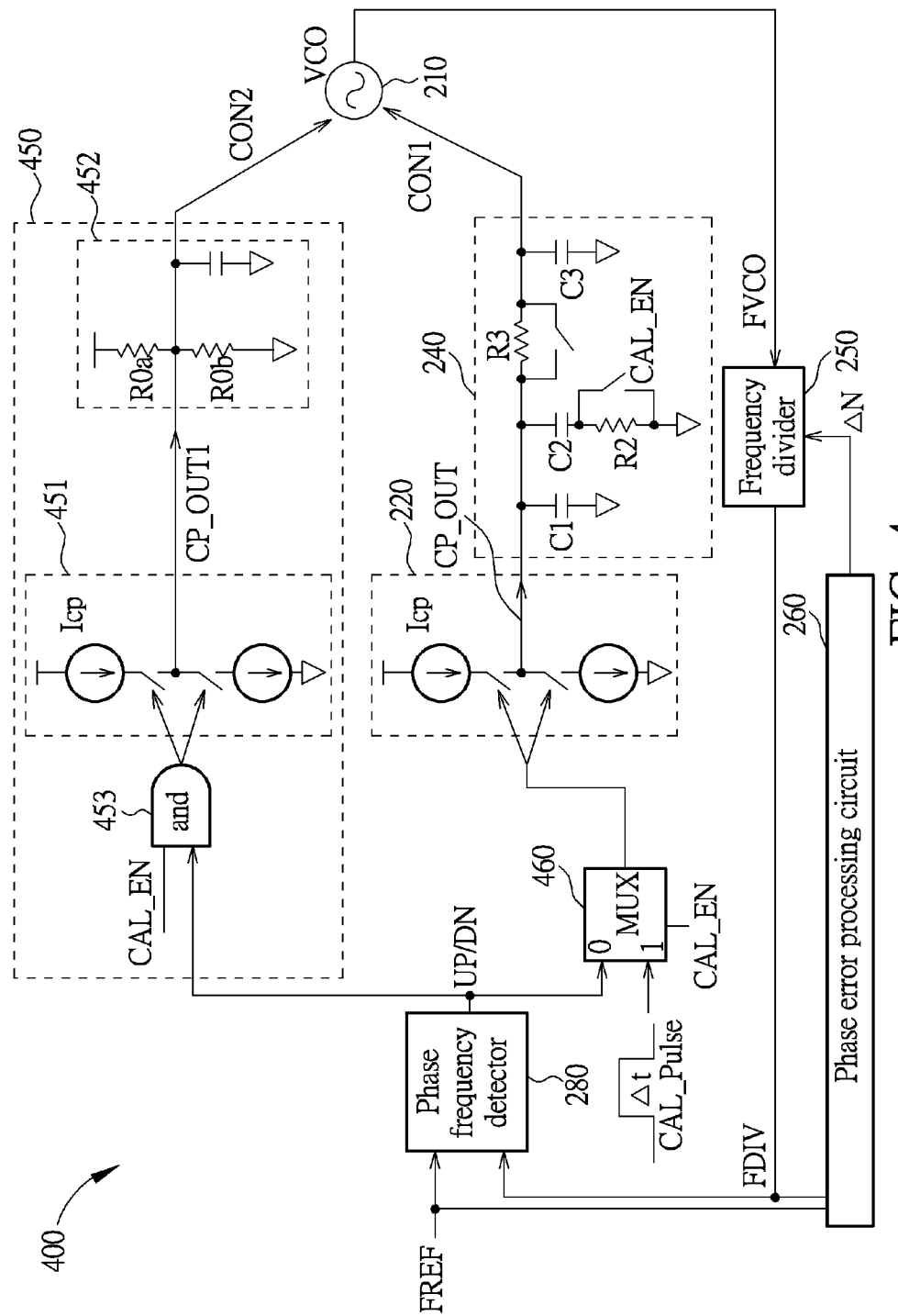
FIG. 4 is a diagram illustrating a PLL according to an embodiment of the present invention

FIG. 4 is a diagram illustrating a PLL 400 according to an embodiment of the present invention. The difference between the PLL 200 and the PLL 400 is that the PLL 400 further includes a phase alignment circuit 450 and a multiplexer (MUX) 460. An objective of the phase alignment circuit 450 is to accelerate the alignment of the reference signal FREF and the feedback signal FDIV.

The phase alignment circuit 450 receives the detection signal UP/DN, and generates a control signal CON2 to the controllable oscillator 210 according to the detection signal UP/DN when the PLL 400 operates in a calibration mode.

The phase alignment circuit 450 may include an auxiliary charge pump circuit 451, an auxiliary loop filter 452 and an AND gate 453, as shown in FIG. 4. The auxiliary charge pump circuit 451 is arranged to receive the detection signal UP/DN and generate an auxiliary charge pump output CP_OUT1 according to the detection signal. The auxiliary loop filter 452 is arranged to receive the auxiliary charge pump output CP_OUT1 from the auxiliary charge pump circuit 451, and generate the second control signal CON2 to the controllable oscillator 210 according to the auxiliary charge pump output CP_OUT1. More particularly, the auxiliary loop filter 452 may be a type I loop filter. The impedance of the auxiliary loop filter 452 may be extremely large (e.g. raise the resistance values of the resistors R0a and R0b) to more effectively accelerate the alignment of the reference signal FREF and the feedback signal FDIV. Further, the resistance value of the auxiliary loop filter 452 (particularly the resistance values resistors R0a and R0b) may be adjustable in order to fit various design requirements.

The multiplexer 460 has a first input port (denoted as "1"), a second input port (denoted as "0"), and an output port coupled to the charge pump circuit 220. The first input port of the multiplexer 460 is arranged to receive the detection signal UP/DN, the second input port of the multiplexer 460 is arranged to receive the calibration signal CAL_Pulse, and the output port of the multiplexer 460 is arranged to output the detection signal UP/DN to the charge pump circuit 220 when the PLL 400 operates in a normal operation mode, and output the calibration signal CAL_Pulse to the charge pump circuit 220 when the PLL 400 operates in the calibration mode.

Specifically, when the PLL 400 operates in the normal operation mode, the phase alignment circuit 450 is disabled; and when the PLL 400 operates in the calibration mode, the phase alignment circuit 450 is enabled. For example, when the PLL 400 operates in the normal operation mode, the enabling signal CAL_EN can be set to 0, so that the charge pump circuit 220 only receives the detection signal UP/DN, and the phase alignment circuit 450 is disabled (due to the AND gate 453). When the PLL 400 operates in the calibration mode, the enabling signal CAL_EN can be set to 1, so that the charge pump circuit 220 receives the calibration signal CAL_Pulse, and the phase alignment circuit 450 is enabled (due to the AND gate 453).

Note that, in some modifications of this embodiment, the multiplexer 460 may be replaced or removed. For example, the multiplexer 460 may be replaced with another PFD, so that the PFD 280 is arranged to provide signals to one of the charge pump circuit 220 and the phase alignment circuit 450, and the other PFD is arranged to provide signals to the other of the charge pump circuit 220 and the phase alignment circuit 450.

Figure 5:
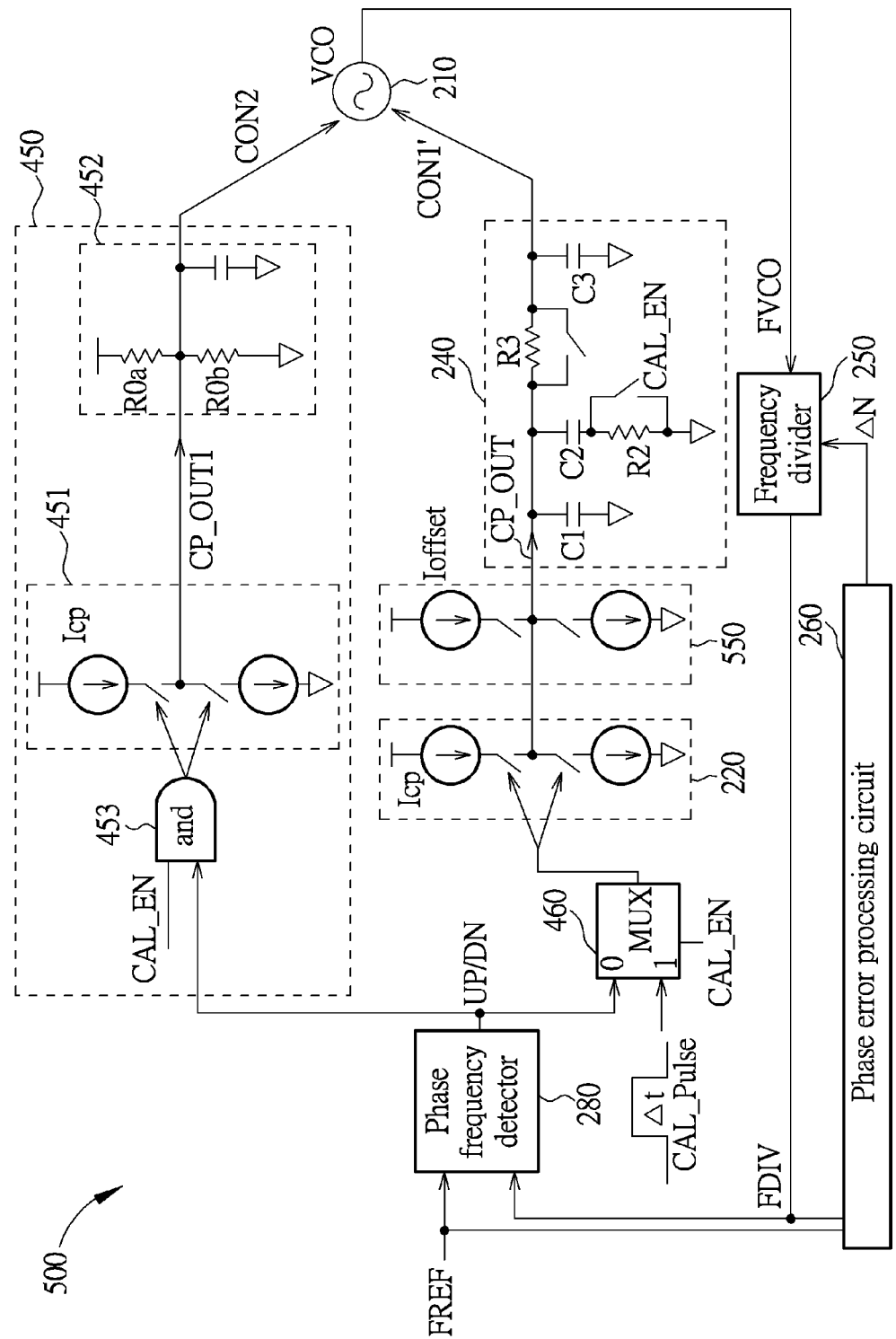
FIG. 5 is a diagram illustrating a PLL according to an embodiment of the present invention.

FIG. 5 is a diagram illustrating a PLL 500 according to an embodiment of the present invention. The difference between the PLL 400 and the PLL 500 is that the PLL 500 further includes an offset current source 550 arranged to calibrate the control signal outputted to the controllable oscillator (e.g. the calibrated control signal CON1' shown in FIG. 5). This adaptive compensation scheme may further improve the calibration accuracy, and can be applied to the PLL 200 shown in FIG. 2. The offset current source 550 shown in FIG. 5 is merely for illustrative purposes, and not meant to be a limitation of the present invention.

Figure 6:
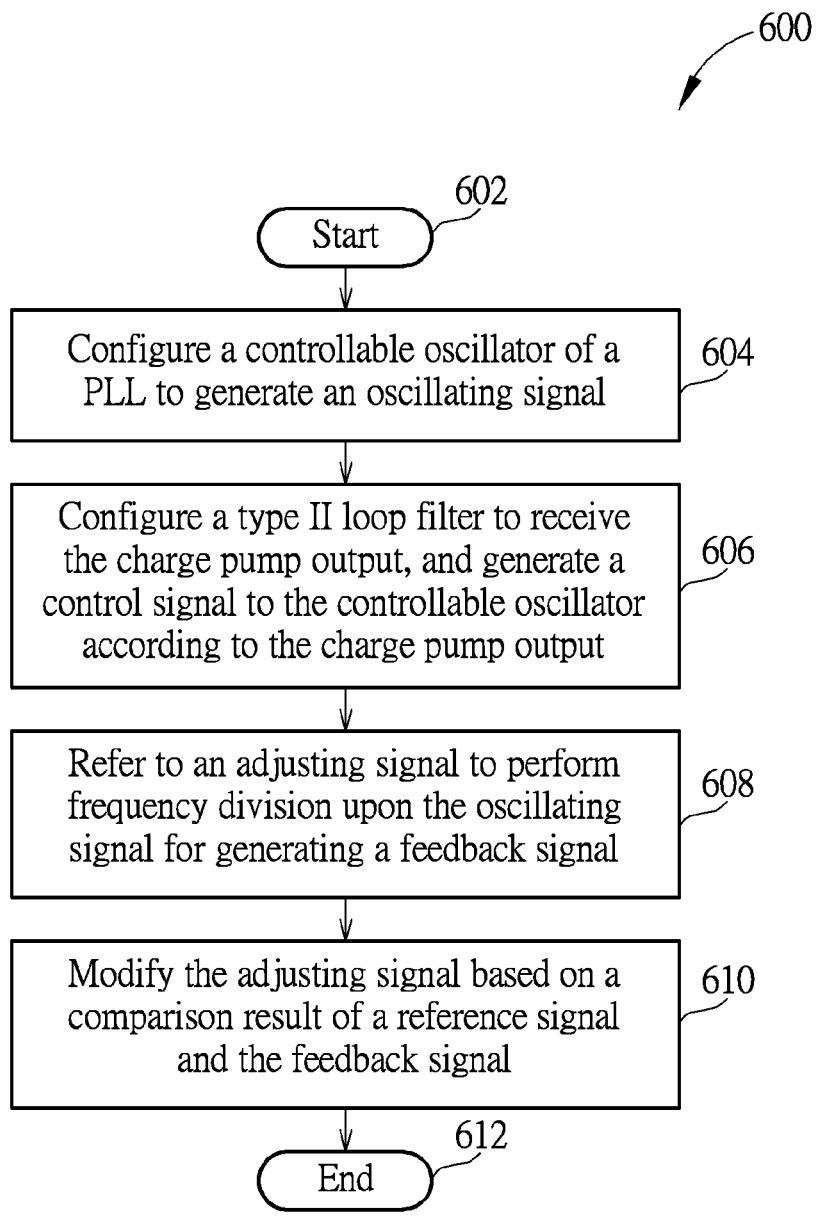
FIG. 6 is a flowchart illustrating a detecting method according to an embodiment of the present invention.

FIG. 6 is a flowchart illustrating a detecting method according to an embodiment of the present invention. If the result is substantially the same, the steps are not required to be executed in the exact order shown in FIG. 6. The method shown in FIG. 6 may be employed by any of the PLLs 200, 400 and 500, and can be briefly summarized as follows.

Step 602: Start;

Step 604: Configure a controllable oscillator of a PLL to generate an oscillating signal;

Step 606: Configure a type II loop filter to receive the charge pump output, and generate a control signal to the controllable oscillator according to the charge pump output;

Step 608: Refer to an adjusting signal to perform frequency division upon the oscillating signal for generating a feedback signal;

Step 610: Modify the adjusting signal based on a comparison result of a reference signal and the feedback signal.

Step 610: End.

To summarize, the present invention provides a type II PLL to solve the problem that a type I PLL cannot track temperature ramping, which causes frequency errors when the temperature changes. The present invention also provides a loop gain calibration scheme to solve the influence of VCO variations, and a phase alignment circuit to accelerate the alignment of the PFD input phase (e.g. the alignment of the reference signal FREF and the feedback signal FDIV shown in FIGS. 2, 4 and 5).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase locked loop, comprising:
    a controllable oscillator, arranged to generate an oscillating signal;
    a charge pump circuit, arranged to receive a calibration signal and generate a charge pump output according to the calibration signal when the PLL operates in a calibration mode;
    a type II loop filter, arranged to receive the charge pump output, and generate a first control signal to the controllable oscillator according to the charge pump output;
    a frequency divider, arranged to receive the oscillating signal outputted from the controllable oscillator and an adjusting signal, and refer to the adjusting signal to perform frequency division upon the oscillating signal for generating a feedback signal; and
    a phase error processing circuit, arranged to receive the feedback signal and a reference signal, and output the adjusting signal based on a comparison result of the reference signal and the feedback signal, wherein the phase error processing circuit comprises:
        a phase frequency detector, arranged to receive the feedback signal and the reference signal, and compare the feedback signal and the reference signal to generate a detection signal;
        an Up-Down convertor, arranged to generate a divisor code signal according to the detection signal; and
        a sigma-delta modulator, arranged to receive the divisor code signal and generate the adjusting signal based on the divisor code signal.

2. The PLL of claim 1, wherein the charge pump circuit comprises an offset current source arranged to calibrate the control signal outputted to the controllable oscillator.

3. The PLL of claim 1, wherein the type II loop filter comprises at least a capacitor and a resistor coupled in series.

4. The PLL of claim 1, wherein the adjusting signal is arranged to adjust a dividing factor of the frequency divider according to a variation of a frequency of the VCO, and a loop gain calibration parameter is obtained from Equation:

$$K_{LG} = \frac{K_{VCO} \cdot I_{CP}}{N \cdot A_0} \cdot \frac{N'}{K_{VCO}' \cdot I_{CP}'/A_0'},$$

wherein $K_{LG}$ denotes the loop gain calibration parameter, $K_{VCO}$ denotes an ideal gain of the controllable oscillator, $K_{VCO}'$ denotes an actual gain of the controllable oscillator, $I_{CP}$ denotes an ideal current value of the charge pump circuit, $I_{CP}'$ denotes an actual current value of the charge pump circuit, N denotes an ideal dividing factor, N' denotes an actual dividing factor, $A_0$ denotes an ideal capacitance value of the type II loop filter when the PLL operates in the calibration mode, and $A_0'$ denotes an actual capacitance value of the type II loop filter when the PLL operates in the calibration mode.

5. The PLL of claim 1, further comprising:
a phase alignment circuit, arranged to receive the detection signal, and generate a second control signal to the controllable oscillator according to the detection signal when the PLL operates in the calibration mode.

6. The PLL of claim 5, wherein the phase alignment circuit comprises:
an auxiliary charge pump circuit, arranged to receive the detection signal and generate an auxiliary charge pump output according to the detection signal; and
an auxiliary loop filter, arranged to receive the auxiliary charge pump output and generate the second control signal to the controllable oscillator according to the auxiliary charge pump output.

7. The PLL of claim 6, wherein the auxiliary loop filter is a type I loop filter.

8. The PLL of claim 5, wherein when the PLL operates in a normal operation mode, the phase alignment circuit is disabled.

9. The PLL of claim 5, further comprising:
a multiplexer, having a first input port, a second input port, and an output port, wherein the first input port is arranged to receive the detection signal, the second input port is arranged to receive the calibration signal, and the output port is arranged to output the detection signal to the charge pump circuit when the PLL operates in a normal operation mode, and output the calibration signal to the charge pump circuit when the PLL operates in the calibration mode.

10. A method for controlling a phase locked loop (PLL), comprising:
configuring a controllable oscillator to generate an oscillating signal;
generating a charge pump output of a charge pump circuit according to a calibration signal when the PLL operates in a calibration mode;
configuring a type II loop filter to receive the charge pump output, and generate a first control signal to the controllable oscillator according to the charge pump output;
referring to an adjusting signal to perform frequency division upon the oscillating signal for generating a feedback signal; and
modifying the adjusting signal based on a comparison result of a reference signal and the feedback signal;
wherein the adjusting signal is generated by:
comparing the feedback signal and the reference signal to generate a detection signal;
generating a divisor code signal according to the detection signal; and
generating the adjusting signal based on the divisor code signal.

11. The method of claim 10, wherein the charge pump circuit comprises an offset current source arranged to calibrate the control signal outputted to the controllable oscillator.

12. The method of claim 10, wherein the type II loop filter comprises at least a capacitor and a resistor coupled in series.

13. The method of claim 10, wherein the adjusting signal is arranged to adjust a dividing factor of the frequency divider according to a variation of a frequency of the VCO, and the loop gain calibration parameter is obtained from Equation:

$$K_{LG} = \frac{K_{VCO} \cdot I_{CP}}{N \cdot A_0} \cdot \frac{N'}{K_{VCO}' \cdot I_{CP}'/A_0'},$$

wherein $K_{LG}$ denotes the loop gain calibration parameter, $K_{VCO}$ denotes an ideal gain of the controllable oscillator, $K_{VCO}'$ denotes an actual gain of the controllable oscillator, $I_{CP}$ denotes an ideal current value of the charge pump circuit, $I_{CP}'$ denotes an actual current value of the charge pump circuit, N denotes an ideal dividing factor, N' denotes an actual dividing factor, $A_0$ denotes an ideal capacitance value of the type II loop filter when the PLL operates in the calibration mode, and $A_0'$ denotes an actual capacitance value of the type II loop filter when the PLL operates in the calibration mode.

14. The method of claim 10, further comprising:
generating a second control signal to the controllable oscillator according to the detection signal when the PLL operates in the calibration mode.

15. The method of claim 14, wherein the phase alignment circuit comprises:
an auxiliary charge pump circuit, arranged to receive the detection signal and generate an auxiliary charge pump output according to the detection signal; and
an auxiliary loop filter, arranged to receive the auxiliary charge pump output and generate the second control signal to the controllable oscillator according to the auxiliary charge pump output.

16. The method of claim 15, wherein the auxiliary loop filter is a type I loop filter.

17. The method of claim 14, wherein when the PLL operates in a normal operation mode, the phase alignment circuit is disabled.

18. The method of claim 14, further comprising:
a multiplexer, having a first input port, a second input port, and an output port, wherein the first input port is arranged to receive the detection signal, the second input port is arranged to receive the calibration signal, and the output port is arranged to output the detection signal to the charge pump circuit when the PLL operates in a normal operation mode, and output the calibration signal to the charge pump circuit when the PLL operates in the calibration mode.

\* \* \* \* \*